(12) United States Patent
Mitomo

(10) Patent No.: US 9,153,580 B2
(45) Date of Patent: Oct. 6, 2015

(54) HIGH-FREQUENCY MOS TRANSISTOR LAYOUT TO REDUCE PARASITIC GATE RESISTANCE AND PARASITIC GATE-TO-DRAIN CAPACITANCE

(71) Applicant: KABUSHIKI KAISHA TOSHIBA, Minato-ku, Tokyo (JP)

(72) Inventor: Toshiya Mitomo, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/453,015

(22) Filed: Aug. 6, 2014

(65) Prior Publication Data

US 2015/0041919 A1    Feb. 12, 2015

(30) Foreign Application Priority Data

Aug. 6, 2013  (JP) ................................. 2013-163396

(51) Int. Cl.
| | | |
|---|---|---|
| *H01L 23/528* | (2006.01) | |
| *H01L 27/088* | (2006.01) | |
| *H01L 23/522* | (2006.01) | |
| *H01L 23/482* | (2006.01) | |

(52) U.S. Cl.
CPC .......... *H01L 27/088* (2013.01); *H01L 23/4824* (2013.01); *H01L 23/528* (2013.01); *H01L 23/5222* (2013.01); *H01L 23/5228* (2013.01)

(58) Field of Classification Search
None
See application file for complete search history.

(56) References Cited

U.S. PATENT DOCUMENTS

| | | | | |
|---|---|---|---|---|
| 8,178,908 | B2 * | 5/2012 | Greenberg et al. | ............ 257/211 |
| 8,829,572 | B2 * | 9/2014 | Jagannathan et al. | ........ 257/256 |
| 2007/0228424 | A1 * | 10/2007 | Igarashi | ......................... 257/256 |
| 2011/0241126 | A1 * | 10/2011 | Herberholz | .................... 257/401 |

OTHER PUBLICATIONS

Babak Heydari et al, "Millimeter-Wave Devices and Circuit Blocks up to 104 GHz in 90 nm CMOS", IEEE Journal of Solid-State Circuits, vol. 42, No. 12, Dec. 2007, pp. 2893-2903 (in English).

* cited by examiner

*Primary Examiner* — Marc Armand
*Assistant Examiner* — Younes Boulghassoul
(74) *Attorney, Agent, or Firm* — Holtz, Holtz, Goodman & Chick PC

(57) ABSTRACT

According to one embodiment, a semiconductor is provided with a MOS transistor and 1st to 5th signal lines. The MOS transistor has a gate finger structure with gate terminals. The 1st line is formed parallel to a gate width direction at each of ends of gate terminals and connected to one end of one gate terminal. The 2nd line connected to the 1st line is formed perpendicular to the direction outside an active region. The 3rd line with a smaller line width than a gate width is formed perpendicular to the direction and connected to each drain on the active region. The 4th line connected to a source is formed parallel to the direction. The 5th line connected to the 4th line is formed such that the 5th line does not overlap the 2nd line.

10 Claims, 7 Drawing Sheets

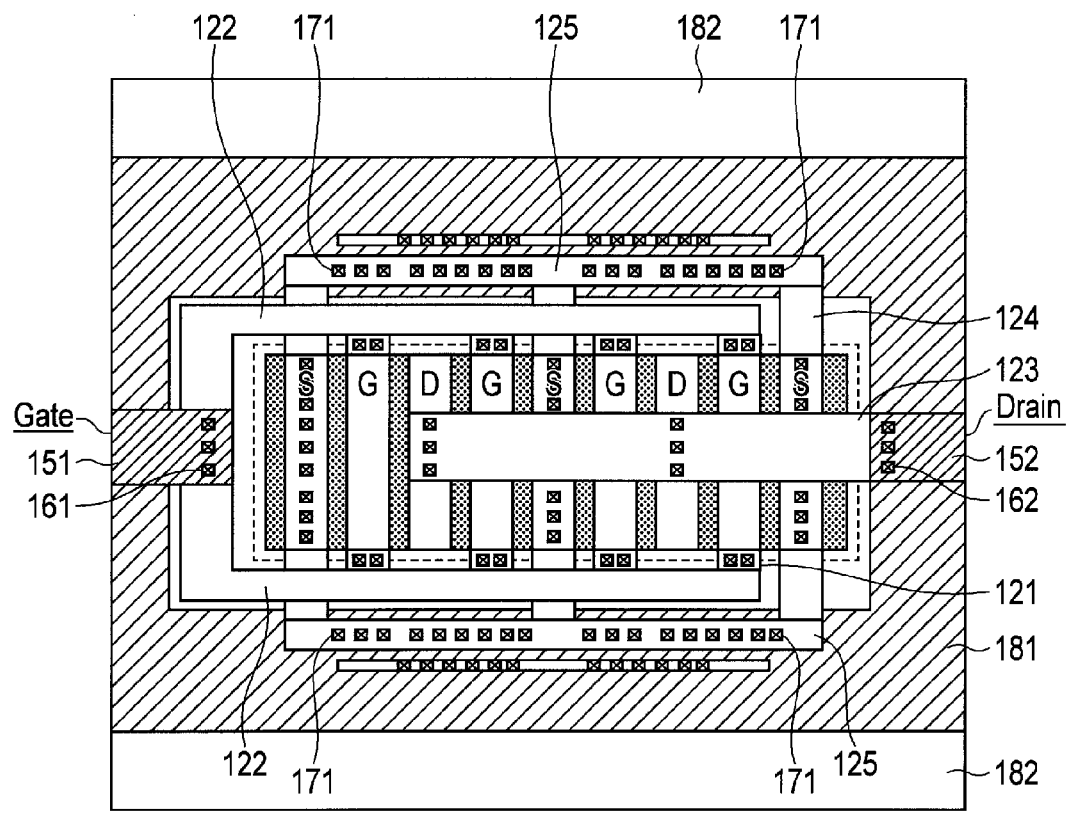
F I G. 3A
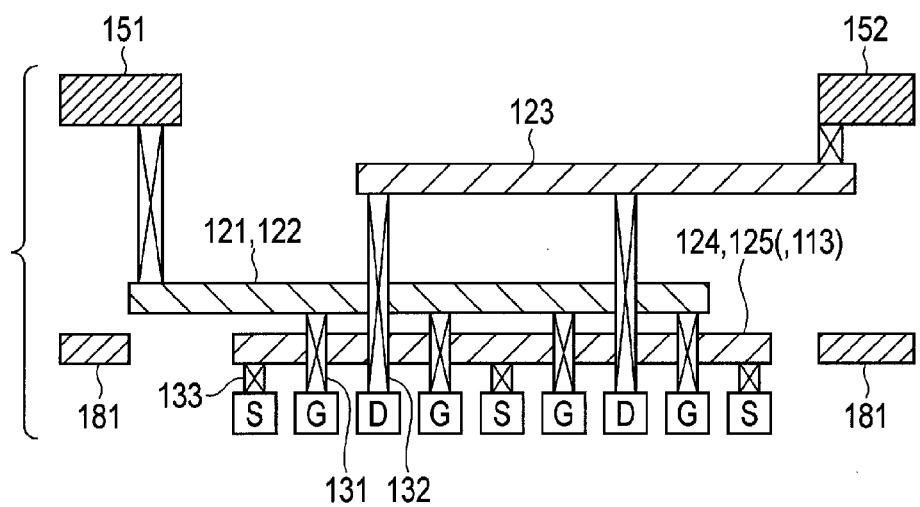
F I G. 3B

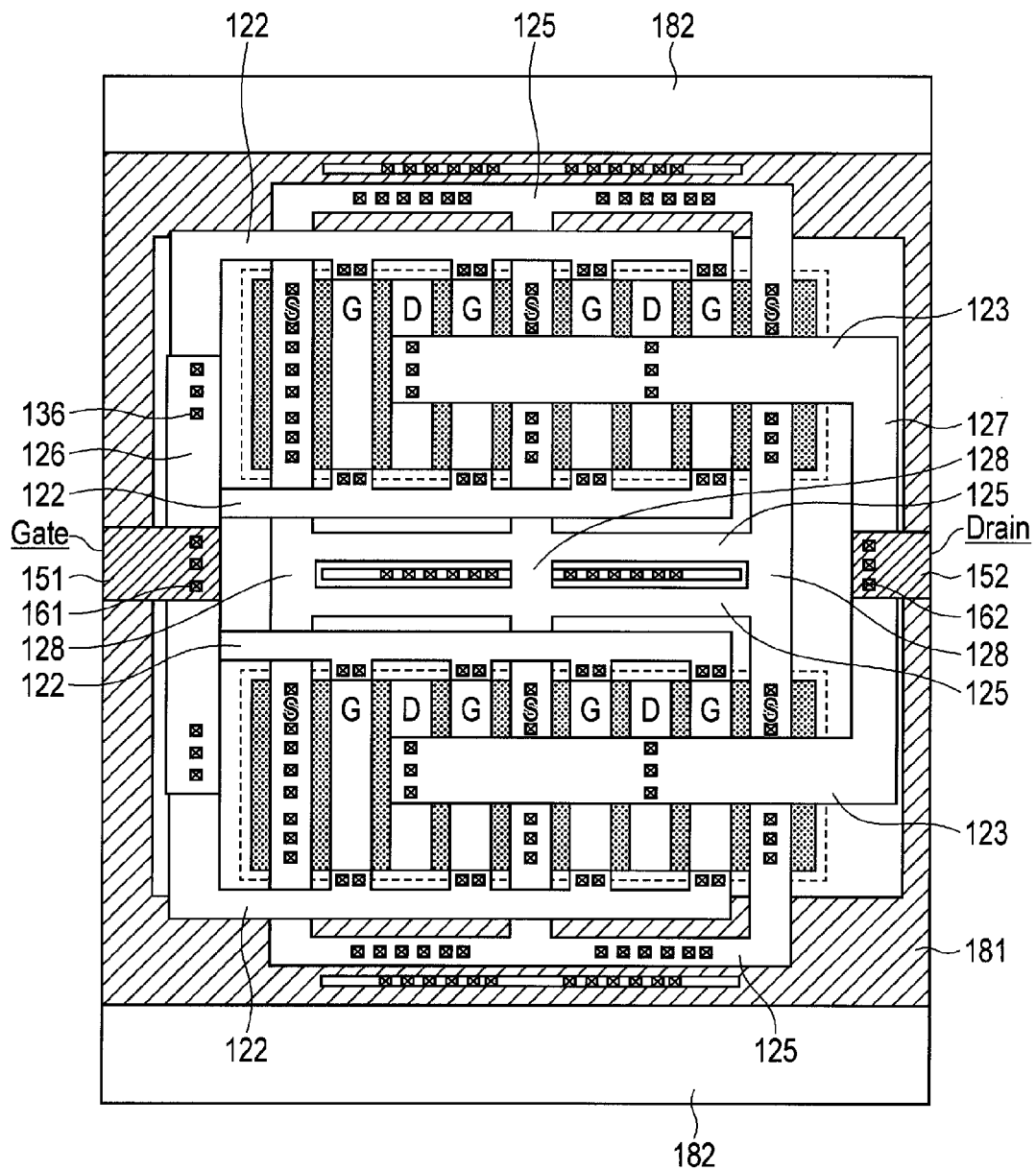
F I G. 6

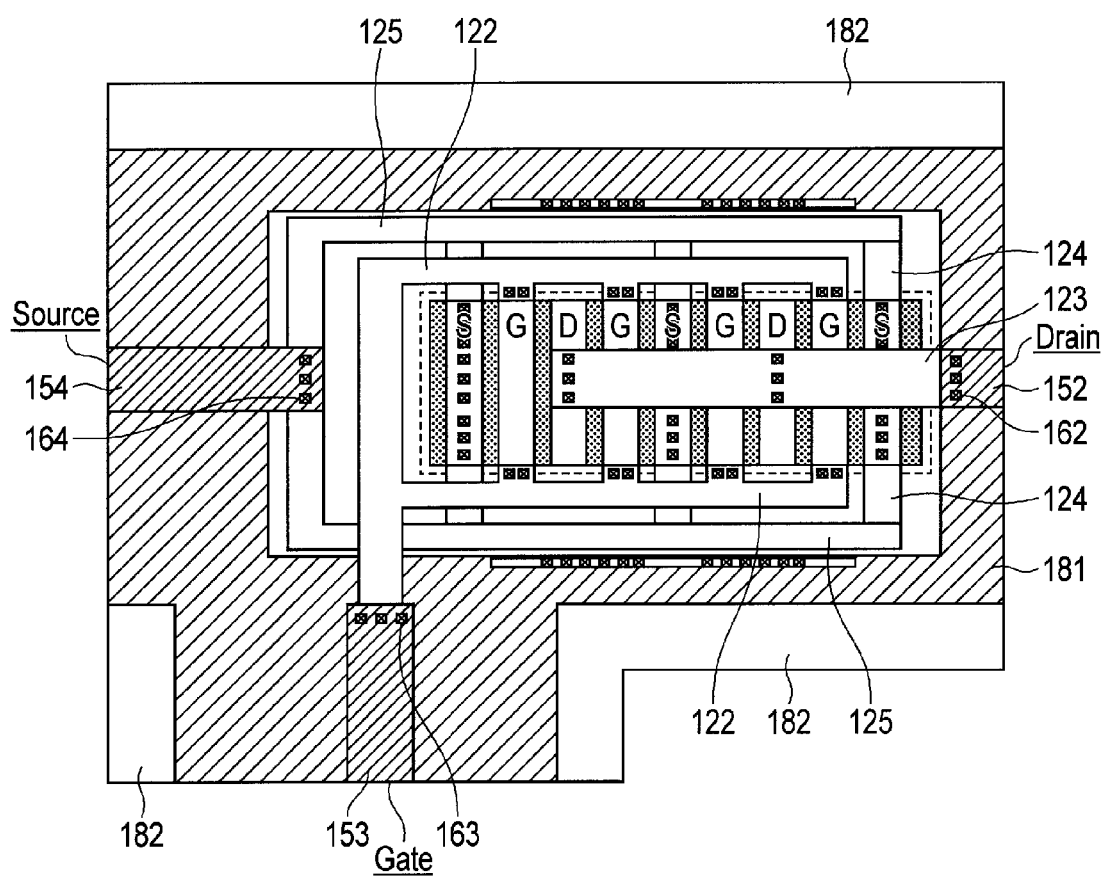
F I G. 7

HIGH-FREQUENCY MOS TRANSISTOR LAYOUT TO REDUCE PARASITIC GATE RESISTANCE AND PARASITIC GATE-TO-DRAIN CAPACITANCE

CROSS-REFERENCE TO RELATED APPLICATIONS

This application is based upon and claims the benefit of priority from Japanese Patent Application No. 2013-163396, filed on Aug. 6, 2013, the entire contents of which are incorporated herein by reference.

FIELD

Embodiments described herein relate to a semiconductor device.

BACKGROUND

In a high-frequency transistor, deterioration in gain and a noise characteristic caused by parasitic resistance of the gate are not negligible.

As a method of reducing the gate parasitic resistance, a method of using a finger structure in order to decrease the gate width is known. However, this method has problems that, e.g., the reduction in gate width is limited, and the characteristics deteriorate due to the influence of the wiring parasitic capacitance and substrate parasitic capacitance/resistance because many fingers are necessary.

As a method of solving the above-mentioned problems, there is a method of forming signal terminals at either end of each gate. This method can reduce the gate parasitic resistance to ¼ when compared to a case in which a signal terminal is formed at only one side of each gate (i.e., a case in which a signal is extracted from only one side of each gate).

Unfortunately, this method is disadvantageous in that the wiring structure is complex. In one method, for example, signal lines extracted from gates and signal lines extracted from drains overlap each other, so the gate-to-drain wiring parasitic capacitance (Cgd) increases. When using a transistor as an amplifier, Cgd is multiplied by the gain as a Miller capacitance with respect to the input terminal, so the gain deteriorates. Even when a matching circuit is connected, the gain performance (fmax ((max) or maximum available power gain (MAG)) deteriorates due to the influence of the load resistance. Also, since isolation between the output terminal (drain) and input terminal (gate) deteriorates, the oscillation stability decreases. To increase the stability, the power gain must be decreased, and as a consequence the gain characteristic deteriorates.

Furthermore, a transistor having a round structure in which a Cgd increase is small has been proposed as another method. However, the round structure poses other problems, such as a reduction in degree of freedom of the transistor size and an increase in packaging area.

No conventional technique which suppresses the increase in gate-to-drain capacitance while reducing the gate parasitic resistance is known.

BRIEF DESCRIPTION OF THE DRAWINGS

FIGS. 3A and 3B are views for explaining a semiconductor device of the second embodiment;

FIG. 6 is a view for explaining a semiconductor device of the fourth embodiment;

FIG. 7 is a view for explaining a semiconductor device of the fifth embodiment.

DETAILED DESCRIPTION

Figure 1A:
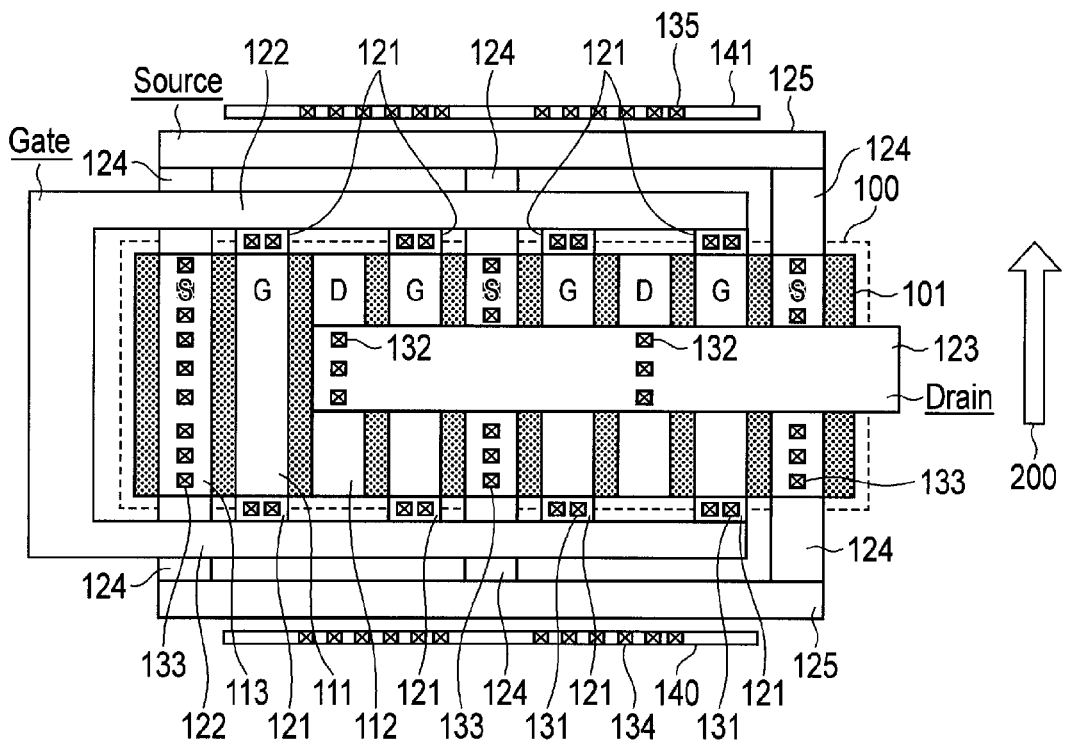
FIGS. 1A and 1B are views for explaining a semiconductor device of the first embodiment.

Wireless communication apparatuses according to the embodiments of the present invention will be explained in detail below with reference to the accompanying drawings. Note that in the following embodiments, portions denoted by the same reference numerals perform the same operations, and a repetitive explanation will be omitted.

According to one embodiment, a semiconductor device is provided with a MOS transistor and first to fifth signal lines. The MOS transistor has a gate finger structure including a plurality of gate terminals. The first signal line is formed at each of two ends of the plurality of gate terminals, connected to one end of one gate terminal, and formed in a direction parallel to a gate width direction. The second signal line is formed in a direction perpendicular to the gate width direction in a region outside an active region of the transistor, and connected to the first signal line. The third signal line is connected to each drain on the active region, formed in the direction perpendicular to the gate width direction, and having a line width smaller than a gate width of the transistor. The fourth signal line is connected to a source and formed in the direction parallel to the gate width direction. The fifth signal line is connected to the fourth signal line and formed in an arrangement where the fifth signal line does not overlap the second signal line.

According to this embodiment, it is possible to suppress the increase in gate-to-drain capacitance while reducing the gate parasitic resistance.

(First Embodiment)

A semiconductor device will be explained below by taking, as an example, a high-frequency MOS transistor in which a finger structure is used as each of the gate, source, and drain.

Figure 1B:
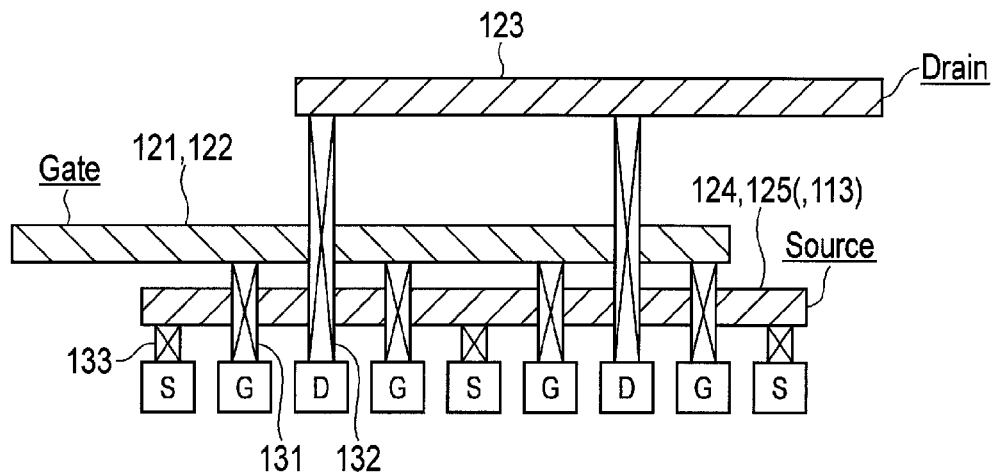

FIG. 1A shows a structural top view for explaining the transistor of the first embodiment. FIG. 1B shows a schematic sectional view for explaining a layer relationship between a plurality of signal lines forming the transistor.

In FIG. 1A, reference numeral 100 denotes a transistor core; 101, an active region; 111, a gate finger; 112, a drain finger; 113, a source finger; 121, a first signal line; 122, a second signal line; 123, a third signal line; 124, a fourth signal line; 125, a fifth signal line; 131 to 135, through vias; and 140 and 141, substrate terminals.

Note that in FIG. 1A, some reference numerals of portions to be denoted by the same reference numerals are omitted in order to reduce the complexity of the drawing.

Note also that in FIG. 1A, the direction of an arrow 200 is the "gate width direction" (the gate width direction is the same in other views).

As will be described in detail later, gates (the gate electrodes 111) on the active region 101 are connected by the first signal lines 121 and second signal line 122. Drains (drain regions) on the active region 101 are connected by the third signal line 123. Sources (source regions) on the active region 101 are connected by the fourth signal lines 124 and fifth signal lines 125 (and the lines 113).

The first to fifth signal lines are desirably arranged by lines using a multilayer metal structure. Note that the sectional view in FIG. 1B does not strictly express the section of the transistor shown in FIG. 1A, but schematically expresses the section in order to explain the positional relationship (layer relationship) in the depth direction of the first to fifth signal lines in the multilayer metal structure.

As shown in FIG. 1A, the MOS transistor includes the transistor core portion 100, and the lines 121 to 125 extracted from the transistor core 100. The transistor core 100 is formed on the active region 101. Also, as indicated by G (gate), D (drain), and S (source) in FIG. 1A, the transistor core 100 includes finger structures (111 to 113) including a plurality of gate fingers, a plurality of drain fingers, and a plurality of source fingers.

Each gate finger 111 is connected to the first signal lines 121 via the through vias 131. Referring to FIG. 1A, the first signal lines 121 are connected to the two sides of each gate finger 111 (the upper and lower ends of each gate finger 111 shown in FIG. 1A).

The through via may have one via structure, or a structure including a metal portion of each metal layer.

As shown in FIG. 1A, the plurality of first signal lines 121 are connected by the second signal line 122 arranged at right angles to the gate width direction (or, that portion of the second signal line 122, which is arranged at right angles to the gate width direction).

Note that the second signal line is desirably formed in a region outside the active region 101 (the gates on the active region 101).

In this wiring structure, signals can be input to and output from the two ends of each gate finger 111, so the gate parasitic resistance can be reduced.

Figure 2A:
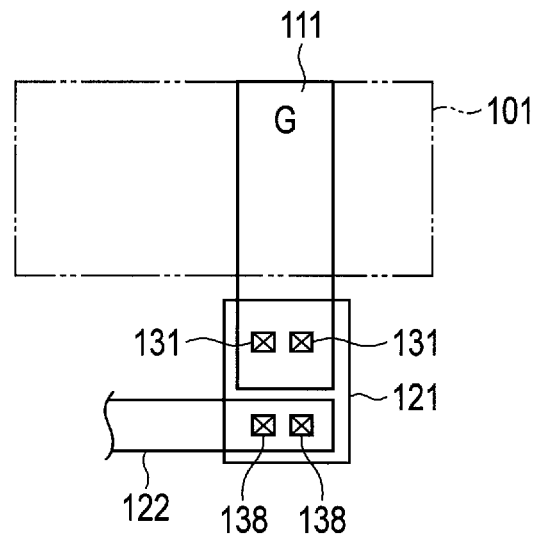
FIGS. 2A and 2B are views for explaining signal line variations.
Figure 2B:
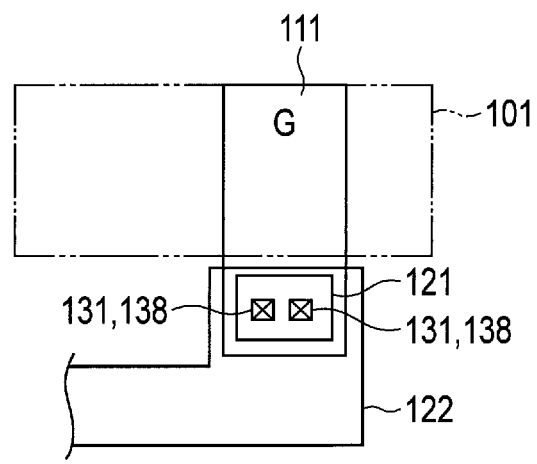

Note that in FIG. 1A, it is assumed that the first signal lines 121 and second signal line 122 are integrally formed by the same layer. However, the first signal lines 121 and second signal line 122 may also be formed by different layers, and connected via through vias. In this case, the gate fingers 111 can be connected to the first signal lines 121 and second signal line 122 by all sorts of variations. For example, they can be connected as shown in FIG. 2A or 2B, but the present invention is not limited to this. Note that in FIG. 2A or 2B, reference numeral 138 denotes a through via.

Each drain finger 112 is connected from each drain on the active region 101 to the third signal line 123 arranged at a right angle to the gate width direction via the through via 132. The drains are connected in a form in which the third signal line 123 passes over the active region 101 (i.e., over each gate 111 in the active region 101). Note that a structure in which the third signal line 123 does not extend outside the gate finger 111 is preferably formed by making the width of the third signal line 123 smaller than the gate width.

The line 113 on each source finger is connected from each source on the active region 101 via the through via 133. The two sides of the line 113 on each source finger (i.e., the upper and lower ends of each source finger 113 shown in FIG. 1A) are connected to the fourth signal lines 124 parallel to the gate width direction. That is, each source finger is extracted by the fourth signal lines 124 from the two ends of the source finger on the active region 101. The plurality of fourth signal lines 124 are connected by the fifth signal lines 125 arranged at right angles to the gate width direction.

Note that the lines 113 on the source fingers and the fourth signal lines 124 may also be integrally formed by the same layer. Also, the fourth signal lines 124 and fifth signal lines 125 may also be integrally formed by the same layer. Furthermore, the lines 113 on the source fingers, the fourth signal lines 124, and the fifth signal lines 125 may also be integrally formed by the same layer.

In the following explanation, the line 113 on the source finger will be referred to as the source finger 113 in some cases.

As shown in FIG. 1A, it is desirable to form a structure in which the fifth signal lines 125 and the second signal line 122 for connecting the gate fingers 111 do not overlap each other. In this case, for example, the second signal line 122 and fourth signal lines 124 may be orthogonally-crossed each other.

Note that in the example shown in FIG. 1A, the fourth signal lines 124 are connected to the two ends of the source finger 113. However, the fourth signal line 124 may also be connected to only one end of the source finger 113.

Note also that in the example shown in FIG. 1A, the fifth signal line 125 is arranged outside the second signal line 122 with respect to the transistor core 100. However, another arrangement may also be adopted as long as the two kinds of signal lines do not overlap each other. For example, the fifth signal line 125 may be arranged inside the second signal line 122 by inverting the positional relationship shown in FIG. 1A. In this case, for example, the first signal lines 121 and fifth signal lines 125 may be orthogonally-crossed each other.

Furthermore, in the example shown in FIG. 1A, the substrate terminals 140 and 141 for determining the potential of a transistor substrate (not shown) are connected via the through vias 134 and 135 from outside the fifth signal lines 125. However, the substrate terminals 140 and 141 may also be arranged in positions different from those shown in FIG. 1A, provided that extraction is possible from these positions.

In this embodiment, the gate parasitic resistance can be reduced by connecting the signal lines to the two ends of the gate terminal. This makes it possible to suppress the deterioration of the gain and noise factor in a high-frequency circuit. Also, since the first signal lines connected to the gates and the third signal line connected to the drains are perpendicular to each other, the gate-to-drain capacitance can be reduced. Consequently, the deterioration of the gain and stability at high frequencies can be suppressed.

In this embodiment as described above, the intersection or overlap of the gate lines and drain line can largely be reduced. Accordingly, it is possible to reduce the gate-to-drain parasitic capacitance (arisen from complex lines). In addition, signals can be input to and output from the two ends of the gate terminal. This makes it possible to reduce the gate parasitic capacitance (to ¼ that of a one-sided input/output structure).

In this embodiment, therefore, it is possible to suppress the increase in gate-to-drain capacitance while reducing the gate parasitic resistance. This also makes it possible to improve the gain characteristic and suppress the deterioration of the oscillation stability at the same time. It is also possible to suppress the decrease in degree of freedom of design.

Note that the high-frequency MOS transistor of this embodiment can be used in various applications. For example, this transistor is applicable to an analog circuit for processing high frequencies. The transistor is also applicable to, e.g., a high-frequency system, particularly, a wireless system.

As for the plurality of signal lines 121 to 125 of the transistor of this embodiment, a desirable positional relationship (layer relationship) in the depth direction between the first to fifth signal lines when using a multilayer metal structure will be explained below.

As shown in FIG. 1B, the third signal line 123 for connecting the drains is desirably arranged above the first and second signal lines 121 and 122 for connecting the gates. Also, the fourth and fifth signal lines 124 and 125 for connecting the sources (and the lines of the source fingers 113) are desirably arranged as the lowermost layer below the signal lines 121 to 123. As schematically shown in FIG. 1B, the signal lines are connected from the finger layers by the through vias having different heights. As described previously, each through via can have one via structure or a structure including a metal portion of each metal layer.

In the structure as shown in FIGS. 1A and 1B, the third signal line 123 which passes directly above the gate fingers and is connected to the drains exists at a position (height) spaced apart from the gate fingers, and this makes it possible to reduce the parasitic capacitance between them.

Also, the fourth and fifth signal lines 124 and 125 for connecting the sources form the lowermost layer of the signal lines 121 to 125. This maximizes the wiring parasitic capacitance with respect to the substrate potential. However, the high-frequency circuit is mostly used in an application in which the sources are grounded or in an application in which the impedance is low when viewed from the sources. Accordingly, the deterioration of the circuit characteristics caused by the increase in capacitance is very small. By introducing the layer relationship as shown in FIG. 1B, therefore, it is possible to further reduce the gate-to-drain parasitic capacitance in addition to the above-described effects.

In the structure as shown in FIG. 1B as described above, it is possible to reduce the parasitic capacitance (gate-to-drain parasitic capacitance) generated between each gate and the third signal line which passes over the gate and connects each drain. Also, the length of the second signal line for connecting each gate can be minimized. This makes it possible to suppress the increase in gate parasitic resistance caused by a long line.

Note that the layer relationship between the signal lines of the transistor of this embodiment is not limited to the structure shown in FIG. 1B.

(Second Embodiment)

In the second embodiment, the difference from the first embodiment will mainly be explained below.

In this embodiment, transmission lines (for two terminals) are applied to the transistor of the first embodiment.

FIG. 3A is a structural top view for explaining a transistor of this embodiment. FIG. 3B is a schematic sectional view for explaining the layer relationship between a plurality of signal lines forming the transistor.

In FIG. 3A, reference numeral 151 denotes a first transmission line; 152, a second transmission line; 161, 162, and 171, through vias; 181, a bottom-surface common terminal; and 182, a side-surface common terminal. Note that in FIG. 3A, some reference numerals of portions corresponding to FIG. 1A are omitted in order to reduce the complexity of the drawing.

The transmission lines are formed by signal line portions (151 and 152 in FIG. 3A), and common (ground) terminal portions (181 and 182 in FIG. 3A).

FIG. 3A shows a structure in which second signal line 122 and a third signal line 123 for connecting the gates and drains of the transistor explained in the first embodiment are respectively connected to the first transmission line 151 and second transmission line 152.

The structure of the transmission lines can be any structure, such as a microstrip structure including the bottom-surface common terminal (181), a coplanar structure including the common terminals (182) on the side surfaces of the signal line, or a bottom-surface grounded coplanar structure including the common terminals (181 and 182) on both the bottom and side surfaces. Note that FIG. 3A exemplarily shows the bottom-surface grounded coplanar structure.

When forming the bottom-surface common terminal 181, as shown in FIG. 3A, the common terminals of the transmission lines are connected so as not to overlap a transistor core 100 and some gate and drain signal lines.

Fourth signal lines 124 or fifth signal lines 125 (in FIG. 3A, the fifth signal lines 125) for connecting source terminals are connected to the common (ground) terminal of the transmission lines.

In this embodiment, the input/output terminals of the transistor function as the transmission lines. Therefore, it is possible to largely reduce unnecessary reflection on the boundary surface, which is difficult to predict. It is also possible to readily improve the estimation accuracy of design. In addition, the fourth signal lines 124 or fifth signal lines 125 for connecting the sources can be connected to the ground (the common terminal of the transmission lines) at a short distance. Accordingly, it is simultaneously possible to reduce an unprepared negative feedback (source degeneration) caused by the wiring parasitic resistance and inductance.

In this embodiment as described above, it is possible to reduce reflection caused by the discontinuous shape of the input (gate) and output (drain), in addition to the effects described in the first embodiment. It is also possible to suppress a gain reduction by an unnecessary feedback by reducing the parasitic resistance and inductance of the ground (source).

(Third Embodiment)

In the third embodiment, the difference from the first embodiment will mainly be explained below.

In this embodiment, a plurality of transistors are applied to the transistor of the first embodiment.

Figure 4:
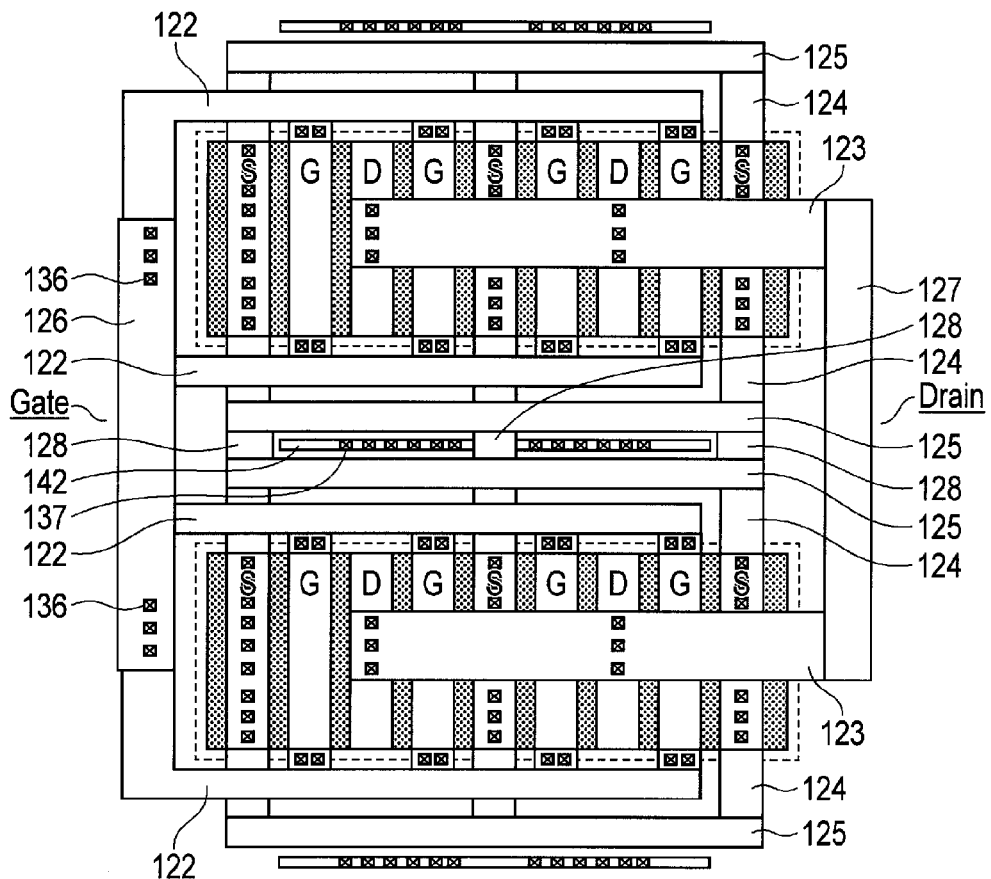
FIG. 4 is a view for explaining a semiconductor device of the third embodiment.

FIG. 4 is a structural top view for explaining the transistors of this embodiment.

In FIG. 4, reference numeral 126 denotes a sixth signal line; 127, a seventh signal line; 128, an eighth signal line; 142, a substrate terminal; and 136 and 137, through vias. Note that in FIG. 4, some reference numerals of portions corresponding to FIG. 1A are omitted in order to reduce the complexity of the drawing.

FIG. 4 shows an arrangement in which a plurality of transistor core portions (see 100 in FIG. 1A) are arranged along the gate width direction (see the direction of the arrow 200 shown in FIG. 1A). The sixth signal line 126 connects two second signal lines 122 for connecting each gate finger (see 111 in FIG. 1A) of each transistor core portion (100). Likewise, the seventh signal line 127 connects two third signal lines 123 for connecting each drain finger 112 of each transistor core portion 100. The eighth signal line 128 connects two fifth signal lines 125 for connecting each source finger 113 of each transistor core portion 100.

Note that in FIG. 4, it is assumed that the third signal lines 123 and seventh signal line 127 are integrally formed by the same layer. However, the third signal lines 123 and seventh signal line 127 may also be formed by different layers, and connected via through vias (not shown).

Note also that in FIG. 4, it is assumed that the lines 113 on the source fingers, fourth signal lines 124, the fifth signal lines 125, and the eighth signal lines 128 are integrally formed by the same layer. However, all or some of these lines may also be formed by different layers and connected via through vias (not shown).

Figure 5A:
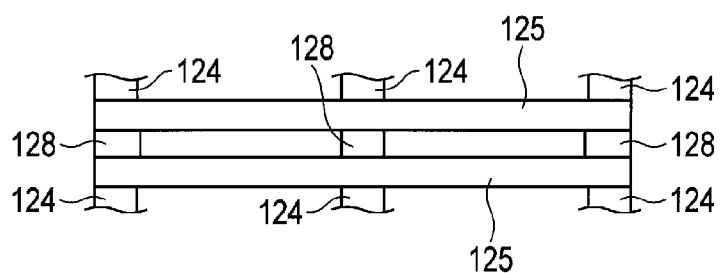
FIGS. 5A and 5B are views for explaining signal line variations.
Figure 5B:
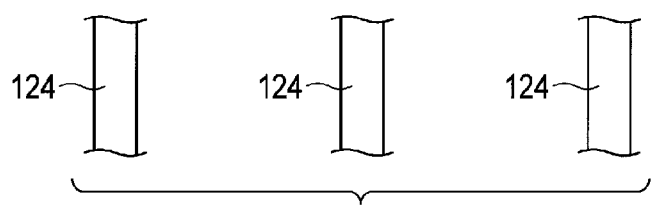

Furthermore, the fourth signal lines 124 may also be used instead of the eighth signal lines 128. That is, in the example shown in FIG. 4, the eighth signal lines 128 are used to connect the fifth signal lines 125 of two MOS transistors as shown in FIG. 5A. However, as shown in FIG. 5B, the fourth signal lines 124 of the two MOS transistors may also be extended and integrally formed.

In this embodiment, when increasing the number of fingers of a transistor, it is possible to prevent the transistor core portion from extending excessively in a direction perpendicular to the gate width direction. This makes it possible to suppress the deterioration of characteristics caused by wiring parasitism and the increase in packaging area on a semiconductor.

Note that the number of MOS transistors is two in FIG. 4, but the number of MOS transistors may also be three or more.

In this embodiment as explained above, it is possible to suppress a gain reduction by the parasitic resistance and inductance caused by a long line in a large transistor including many gate fingers, in addition to the effects described in the first embodiment.

(Fourth Embodiment)

In the fourth embodiment, the difference from the second or third embodiment will mainly be explained below.

In this embodiment, transmission lines (for two terminals) are applied to the transistor of the third embodiment, or a plurality of transistors are applied to the transistor of the second embodiment. That is, transmission lines and a plurality of transistors are applied to the transistor of the first embodiment.

FIG. 6 is a structural top view for explaining the transistor of this embodiment. Note that in FIG. 6, some reference numerals corresponding to FIGS. 1A, 3A, and 4 are omitted in order to reduce the complexity of the drawing.

FIG. 6 shows a structure in which a sixth signal line 126 and seventh signal line 127 for connecting the gates and drains of a plurality of transistor cores (see 100 in FIG. 1A) are respectively connected to a first transmission line 151 and second transmission line 152.

The structure of the transmission lines is the same as that described in the second embodiment, i.e., common terminals 181 and 182 do not overlap the plurality of transistor core portions (100) in the structure.

Eighth signal lines 128 connected to the source terminals of the transistor core portions (100) are connected to the common terminal of the transmission lines. Similarly, fifth signal lines 125 for connecting the sources at the two ends of each of the plurality of transistor core portions (100) are connected to the common terminal.

Note that FIG. 6 exemplarily shows a bottom-surface grounded coplanar structure, but the structure of the transmission lines can be any structure, such as a microstrip structure, coplanar structure, or bottom-surface grounded coplanar structure, as in the second embodiment.

In this embodiment, it is possible to prevent the transistor core portions from extending excessively in a direction perpendicular to the gate width direction when increasing the number of fingers of the transistor, in addition to the effects described in the second embodiment. This makes it possible to suppress the deterioration of characteristics caused by wiring parasitism and the increase in packaging area on a semiconductor.

In this embodiment as described above, it is possible to reduce reflection caused by the discontinuous shape of the input (gate) and output (drain), in addition to the effects described in the first and third embodiments. It is also possible to suppress a gain reduction by an unnecessary feedback by reducing the parasitic resistance and inductance of the ground (source).

(Fifth Embodiment)

In the fifth embodiment, the difference from the second embodiment will mainly be explained below.

In this embodiment, transmission lines for three terminals are applied to the transistor of the second embodiment.

FIG. 7 is a structural top view for explaining the transistor of this embodiment.

In FIG. 7, reference numeral 153 denotes a third transmission line; 154, a fourth transmission line; and 163 and 164, through vias. Note that in FIG. 7, some reference numerals corresponding to FIGS. 1A and 3A are omitted in order to reduce the complexity of the drawing.

Referring to FIG. 7, second signal line 122 for connecting the two ends of each gate finger is connected to the third transmission line 153, a third signal line 123 for connecting each drain is connected to a second transmission line 152, and fifth signal lines 125 for connecting each source are connected to the fourth transmission line 154.

Common terminals of the transmission lines are connected, but do not overlap the signal line portions.

Note that a combination of the directions of the second, third, and fourth transmission lines 152, 153, and 154 with respect to the transistor core portion is not limited to FIG. 7, and can be any combination of any directions.

Note also that FIG. 7 exemplarily shows a bottom-surface grounded coplanar structure. As in the second embodiment, however, the structure of the transmission lines can be any structure, such as a microstrip structure, coplanar structure, or bottom-surface grounded coplanar structure.

This embodiment readily makes it possible to apply the transistor of the embodiment to a transistor circuit in which the source is not grounded, e.g., a gate-grounded circuit or a circuit using a source degeneration element, thereby obtaining the effect of the embodiment.

In this embodiment as described above, it is possible to implement, e.g., a gate-grounded circuit in which the gate is grounded in an alternating current manner, a cascode circuit, or a source degeneration circuit in which a resistor or inductor is connected to the source, in addition to the effects described in the first embodiment.

(Sixth Embodiment)

In the sixth embodiment, the difference from the third or fifth embodiment will mainly be explained below.

In this embodiment, a plurality of transistors are applied to the transistor of the fifth embodiment, or transmission lines of three terminals are applied to the transistor of the third embodiment. That is, transmission lines of three terminals and a plurality of transistors are applied to the transistor of the first embodiment.

Figure 8:
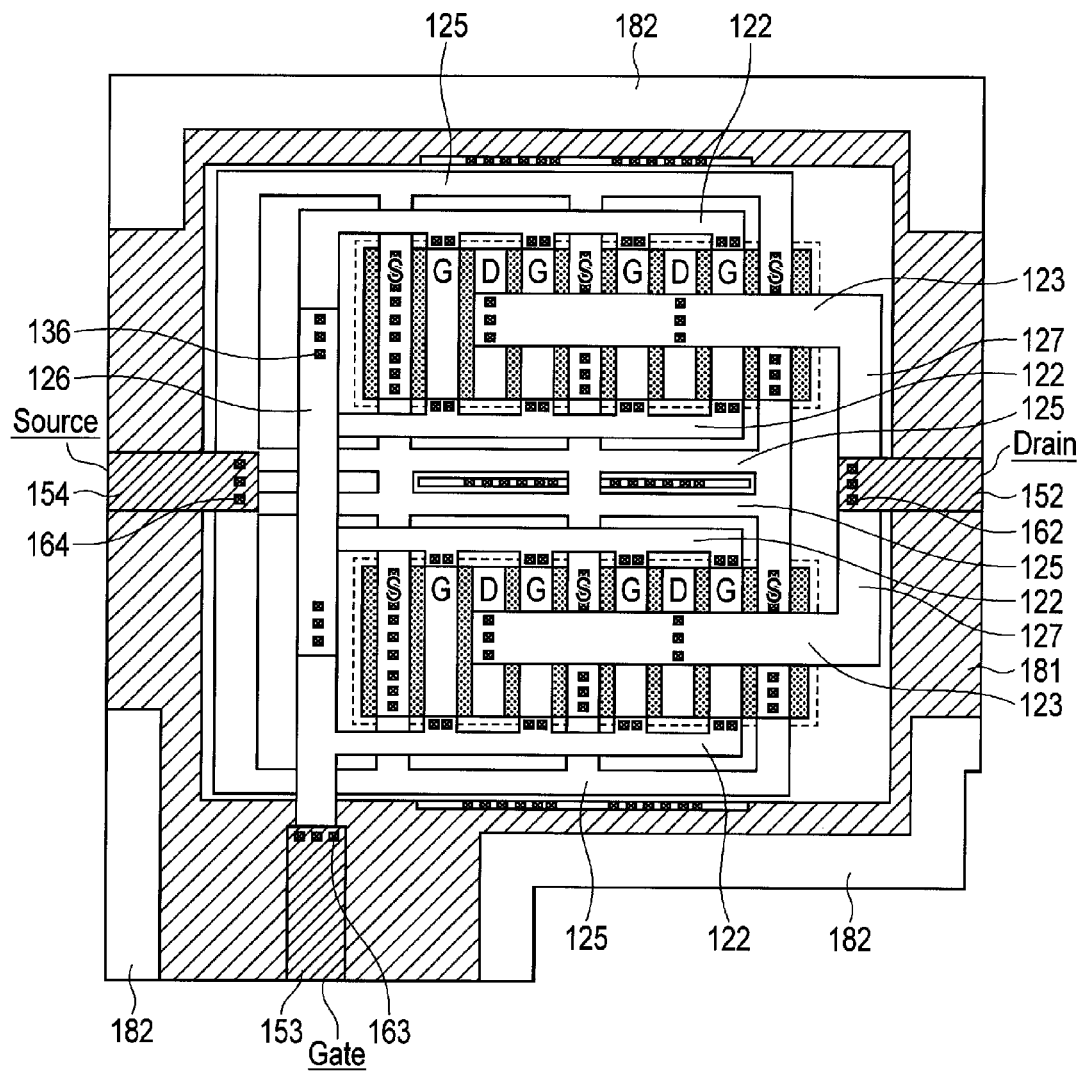
FIG. 8 is a view for explaining a semiconductor device of the sixth embodiment.

FIG. 8 is a structural top view for explaining the transistor of this embodiment. Note that in FIG. 8, some reference numerals of portions corresponding to FIGS. 1A, 3A, and 4 are omitted in order to avoid the complexity of description in the drawing.

FIG. 8 shows a structure in which a sixth signal line 126, a seventh signal line 127, and eighth signal lines 128 for connecting the gates, drains, and sources of a plurality of transistor cores are respectively connected to third, second, and fourth transmission lines 153, 152, and 154.

Common terminals of the transmission lines are connected, but do not overlap the signal line portions.

Note that a combination of the directions of the second, third, and fourth transmission lines 152, 153, and 154 with respect to the transistor core portion is not limited to FIG. 8, and can be any combination of any directions.

Note also that FIG. 8 exemplarily shows a bottom-surface grounded coplanar structure. As in the second embodiment, however, the structure of the transmission lines can be any structure, such as a microstrip structure, coplanar structure, or bottom-surface grounded coplanar structure.

In this embodiment, when increasing the number of fingers of a transistor, it is possible to prevent the transistor core portion from extending excessively in a direction perpendicular to the gate width direction, in addition to the effects described in the fifth embodiment. This makes it possible to suppress the deterioration of characteristics caused by wiring parasitism and the increase in packaging area on a semiconductor.

In this embodiment as described above, it is possible to suppress a gain reduction by the parasitic resistance and inductance caused by a long line in a large transistor including many gate fingers, in addition to the effects described in the sixth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a MOS transistor having a gate finger structure including a plurality of gate terminals;
   a first signal line formed at each of two ends of the plurality of gate terminals, connected to one end of one gate terminal, and formed in a direction parallel to a gate width direction;
   a second signal line formed in a direction perpendicular to the gate width direction in a region outside an active region of the transistor, and connected to the first signal line;
   a third signal line connected to each drain on the active region, formed in the direction perpendicular to the gate width direction, and having a line width smaller than a gate width of the transistor, wherein the third signal line does not overlap the second signal line;
   a fourth signal line connected to a source and formed in the direction parallel to the gate width direction; and
   a fifth signal line connected to the fourth signal line and formed in an arrangement where the fifth signal line does not overlap the second signal line.

2. The device according to claim 1, wherein the first signal line, the second signal line, the third signal line, the fourth signal line, and the fifth signal line are arranged by wiring using a multilayer metal structure, and an arrangement of the first signal line, the second signal line, the third signal line, the fourth signal line, and the fifth signal line in a depth direction is such that an order is (1) the third signal line, (2) the first signal line and the second signal line, and (3) the fourth signal line and the fifth signal line from an uppermost layer.

3. The device according to claim 1, further comprising:
   a first transmission line to which the second signal line is connected; and
   a second transmission line to which the third signal line is connected.

4. The device according to claim 3, further comprising a common terminal to which the fourth signal line or the fifth signal line is connected.

5. The device according to claim 1, wherein
   the semiconductor device comprises a plurality of MOS transistors, the plurality of MOS transistors being arranged along the direction parallel to the gate width direction, and
   the semiconductor device further comprises:
   a sixth signal line to which the second signal line according to each of the plurality of MOS transistors is connected;
   a seventh signal line to which the third signal line according to each of the plurality of MOS transistors is connected; and
   an eighth signal line to which the fourth signal line or the fifth signal line according to each of the plurality of MOS transistors is connected.

6. The device according to claim 5, wherein the fourth signal lines according to the plurality of MOS transistors are integrally formed instead of connecting the fourth signal lines according to the plurality of MOS transistors by using the fifth signal line and the eighth signal line.

7. The device according to claim 5, further comprising:
   a first transmission line to which the sixth signal line is connected; and
   a second transmission line to which the seventh signal line is connected.

8. The device according to claim 7, further comprising a common terminal to which the eighth signal line is connected.

9. The device according to claim 1, further comprising:
   a second transmission line to which the third signal line is connected;
   a third transmission line to which the second signal line is connected; and
   a fourth transmission line to which the fifth signal line is connected.

10. The device according to claim 9, wherein
    the semiconductor device comprises a plurality of MOS transistors, the plurality of MOS transistors being arranged along the direction parallel to the gate width direction, and
    the semiconductor device further comprises:
    a sixth signal line to which the second signal line according to each of the plurality of MOS transistors is connected;
    a seventh signal line to which the third signal line according to each of the plurality of MOS transistors is connected; and
    an eighth signal line to which the fourth signal line or the fifth signal line according to each of the plurality of MOS transistors is connected.

* * * * *